(12) United States Patent
Wei et al.

(10) Patent No.: US 11,057,579 B2
(45) Date of Patent: Jul. 6, 2021

(54) ANTI-OVEREXPOSURE CIRCUIT STRUCTURE AND ELECTRONIC DEVICE USING THE SAME

(71) Applicants: LITE-ON ELECTRONICS (GUANGZHOU) LIMITED, Guangzhou (CN); LITE-ON TECHNOLOGY CORPORATION, Taipei (TW)

(72) Inventors: Shou-Te Wei, Taipei (TW); Wei-Chih Chen, Taipei (TW)

(73) Assignees: LITE-ON ELECTRONICS (GUANGZHOU) LIMITED; LITE-ON TECHNOLOGY CORPORATION

( * ) Notice: Subject to any disclaimer, the term of this patent is extended or adjusted under 35 U.S.C. 154(b) by 0 days.

(21) Appl. No.: 16/700,468

(22) Filed: Dec. 2, 2019

(65) Prior Publication Data

US 2020/0267337 A1  Aug. 20, 2020

Related U.S. Application Data

(60) Provisional application No. 62/807,246, filed on Feb. 19, 2019.

(30) Foreign Application Priority Data

Apr. 25, 2019 (CN) .......................... 201910341808.9

(51) Int. Cl.
H04N 5/351 (2011.01)
H04N 5/3745 (2011.01)
H03K 19/20 (2006.01)
H03K 5/24 (2006.01)

(52) U.S. Cl.
CPC ............... *H04N 5/351* (2013.01); *H03K 5/24* (2013.01); *H03K 19/20* (2013.01); *H04N 5/37452* (2013.01)

(58) Field of Classification Search
CPC .. H04N 5/351; H04N 5/37452; H04N 5/3696; H03K 19/20; H03K 5/24
See application file for complete search history.

(56) References Cited

U.S. PATENT DOCUMENTS

| | | | |
|---|---|---|---|
| 9,762,824 B2 * | 9/2017 | Boemler | H04N 5/37452 |
| 2017/0070688 A1 * | 3/2017 | Pang | H04N 5/353 |
| 2018/0166477 A1 * | 6/2018 | Raynor | H01L 27/14621 |
| 2020/0145593 A1 * | 5/2020 | Gao | H04N 5/35527 |

* cited by examiner

*Primary Examiner* — Padma Haliyur
(74) *Attorney, Agent, or Firm* — Innovation Counsel LLP

(57) ABSTRACT

An anti-overexposure circuit structure and an electronic device using the same are provided. An anti-overexposure circuit structure includes a first capacitor, a second capacitor, a photo diode, a first switch and a control circuit. The photo diode is coupled to the first capacitor and the second capacitor. The first switch is serially connected to the photo diode. The control circuit is coupled to the first switch and configured to: control the first switch to be turned off when SOC of the first capacitor or SOC of the second capacitor the SOC is lower than a predetermined level. As a result, it can prevent pixel unit of the electronic device from being overexposed.

14 Claims, 4 Drawing Sheets

ANTI-OVEREXPOSURE CIRCUIT STRUCTURE AND ELECTRONIC DEVICE USING THE SAME

This application claims the benefit of U.S. provisional application Ser. No. 62/807,246, filed Feb. 19, 2019, the subject matter of which is incorporated herein by reference, and claims the benefit of People's Republic of China application Serial No. 201910341808.9, filed on Apr. 25, 2019, the subject matter of which is incorporated herein by reference.

BACKGROUND OF THE INVENTION

Field of the Invention

The invention relates in general to a circuit structure and an electronic device using the same, and more particularly to an anti-overexposure circuit structure and an electronic device using the same.

Description of the Related Art

The conventional image capture device captures a target image, and further analyzes the distance between the target and the image capture device through the captured image. However, objects in the scene can be far or near. If the exposure time set by the distance measuring device is short, near objects in the image are clear, but far objects are not. Conversely, if the exposure time set by the distance measuring device is long, far objects in the image are clear, but near objects will be over-exposed. Therefore, it has become a prominent task for the industry to provide an anti-overexposure mechanism.

SUMMARY OF THE INVENTION

According to an embodiment of the present invention, an anti-overexposure circuit structure is provided. The anti-overexposure circuit structure includes a first capacitor, a second capacitor, a photo diode, a first switch and a control circuit. The photo diode is coupled to the first capacitor and the second capacitor. The first switch is serially connected to the photo diode. The control circuit is coupled to the first switch and configured to: control the first switch to be at an open circuit stat when state of charge (SOC) of the first capacitor or SOC of the second capacitor is lower than a predetermined level e.

According to another embodiment of the present invention, an electronic device is provided. The electronic device includes the said anti-overexposure circuit structure and a processor. The processor is electrically coupled to the anti-overexposure circuit structure.

The circuit structure and the electronic device using the same of the present invention can prevent overexposure and increase the quality of the captured image.

The above and other aspects of the invention will become better understood with regards to the following detailed description of the preferred but non-limiting embodiment (s). The following description is made with reference to the accompanying drawings.

DETAILED DESCRIPTION OF THE INVENTION

Figure 1:
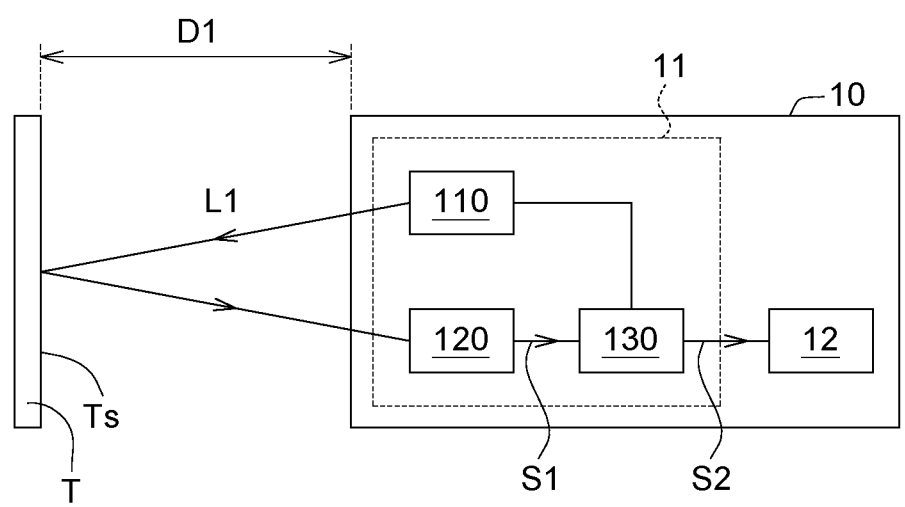
FIG. 1 is a functional block diagram of an electronic device according to an embodiment of the invention.

Referring to FIG. 1, a functional block diagram of an electronic device 10 according to an embodiment of the invention is shown. The electronic device 10 can be realized by such as an image capture device, a distance measuring device or a facial identification device. The electronic device 10 includes an image sensing device 11 and a processor 12. The processor 12 is electrically coupled to the image sensing device 11 to process the information provided by the image sensing device 11. The image sensing device 11 includes a light source 110, an image sensor 120 and a controller 130. In an embodiment, the image sensor 120 and the controller 130 can be integrated as one element. The image sensor 120 and/or the controller 130 can be realized by a physical circuit structure formed using the semi-conductor process. In an embodiment, the image sensing device 11 can be realized by a time of flight (ToF) distance measuring device.

The light source 110 can be realized by a light emitting diode, (LED) or a laser diode (LD), and can emit a light L1 to illuminate a target T. The light L1 is such as infra-red light, but the present invention is not limited thereto. The light L1 is reflected to the image sensor 120 from the target T. Then, the image sensor 120 converts the received reflective light L1 into a reception signal S1. The controller 130 can perform corresponding calculation according to the reception signal S1 received by the image sensor 120 to generate and output an output value S2 to the processor 12. The output value S2 is such as a phase difference. Then, the processor 12 can calculate the distance D1 between the electronic device 10 and the target T according to the phase difference. In addition, the controller 130 can obtain the said phase difference using the time of flight distance measuring technology.

Figure 2A:
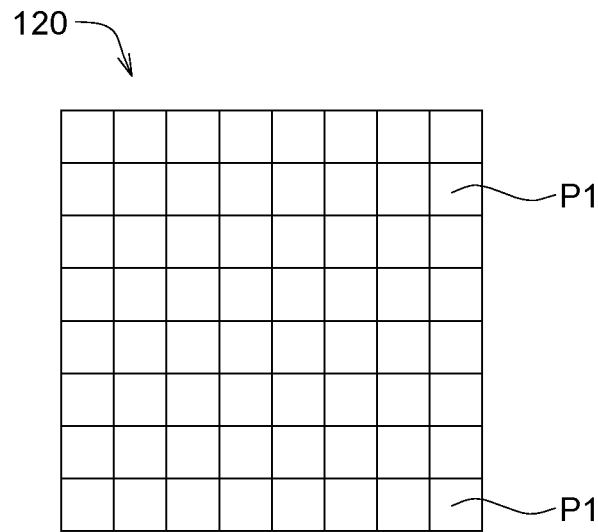
FIG. 2A is a schematic diagram of multiple pixel units of the image sensor of FIG. 1.
Figure 2B:
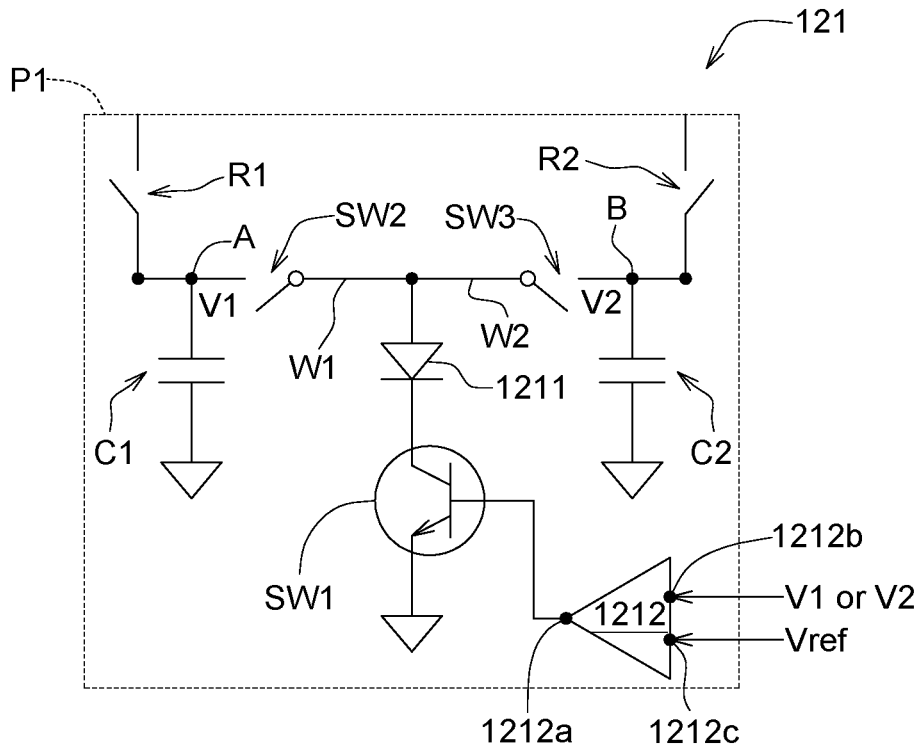
FIG. 2B is a schematic diagram of a pixel unit of an anti-overexposure circuit structure of the image sensor of FIG. 2A.

Refer to FIG. 2A and FIG. 2B. FIG. 2A is a schematic diagram of multiple pixel units P1 of the image sensor 120 of FIG. 1. FIG. 2B is a schematic diagram of a pixel unit P1 of an anti-overexposure circuit structure of the image sensor 120 of FIG. 2A.

As indicated in FIG. 2A and FIG. 2B, the image sensor 120 at least includes an anti-overexposure circuit structure 121, wherein the anti-overexposure circuit structure 121 includes multiple pixel units P1, but FIG. 2B illustrates the circuit structure of only one of the pixel unit P1. As indicated in FIG. 2A, the multiple pixel units P1 are arranged as an N×M matrix, wherein M and N are any positive integers equivalent to or greater than 1, and the values of M and N can be identical or different.

As indicated in FIG. 2B, anyone of the pixel units P1 includes a first capacitor C1, a second capacitor C2, a first switch SW1, a second switch SW2, a third switch SW3, a photo diode 1211, a control circuit 1212, and switches R1 and R2. The photo diode 1211 is coupled to the first capacitor C1 and the second capacitor C2. The control circuit 1212 is electrically coupled to the first switch SW1 and configured to: control the first switch SW1 to be turned off (be at an open circuit state) when the SOC of the first capacitor C1 or the SOC of the second capacitor C2 is lower than a predetermined level to stop the exposure of the pixel unit P1 and avoid the pixel unit P1 being overexposed. Here, the "predetermined level" is such as the maximum capacitance of the first capacitor C1 and/or about 10%-90% of the maximum capacitance of the second capacitor C2.

As indicated in FIG. 2B, the second switch SW2 is electrically coupled between the first capacitor C1 and the photo diode 1211; the third switch SW3 is electrically coupled between the second capacitor C2 and the photo diode 1211.

The process of activating the anti-overexposure function of the pixel unit P1 of the present invention embodiment is disclosed below.

As indicated in FIG. 2B, at anyone of the pixel units P1, firstly, switches R1 and R2 are turned on to charge the first capacitor C1 and the second capacitor C2 concurrently. When the first capacitor C1 and the second capacitor C2 are fully charged, the switches R1 and R2 are turned off. Then, the second switch SW2 and the third switch SW3 are alternately turned on and turned off. For example, in a timing sequence, one of the second switch SW2 and the third switch SW3 is turned off, but the other one of the second switch SW2 and the third switch SW3 is turned on. In the next timing sequence, one of the second switch SW2 and the third switch SW3 is turned on, but the other one of the second switch SW2 and the third switch SW3 is turned off. Thus, the first capacitor C1 and the second capacitor C2 are alternated to be at a dischargeable state. When the photo diode 1211 receives photons (for example, the photo diode 1211 receives the reflected light L1) and the first switch SW1 is at an ON state, the first capacitor C1 or the second capacitor C2, which is at a dischargeable state, can discharge the electricity to a closed circuit.

To put it in a greater detail, when the second switch SW2 is turned on (meanwhile, the third switch SW3 is turned off) and the photo diode 1211 receives photons (the photo diode 1211 is turned on) and the first switch SW1 is at an ON state, the first capacitor C1, the second switch SW2, the photo diode 1211 and the first switch SW1 form a first closed circuit, through which the electricity of the first capacitor C1 can be discharged to reduce the SOC of the first capacitor C1. Similarly, when the third switch SW3 is turned on (meanwhile, the second switch SW2 is turned off) and the photo diode 1211 receives photons (for example, the photo diode 1211 receives the reflected light L1) and the first switch SW1 is at an ON state, the second capacitor C2, the third switch SW3, the photo diode 1211 and the first switch SW1 form a second closed circuit, through which the electricity of the second capacitor C2 can be discharged to reduce the SOC of the second capacitor C2. Within the time interval where the second switch SW2 and the third switch SW3 are alternately turned on, when one of the SOC of the first capacitor C1 and the SOC of the second capacitor C2 is lower than a predetermined level, this indicates that the pixel unit P1 is overexposed. Meanwhile, the control circuit 1212 can switch the first switch SW1 to be turned off to stop the exposure of the pixel unit P1 and avoid the pixel unit P1 being overexposed. Thus, even when the controller 130 sets the alternate switching time interval to the maximum exposure time of the image sensing device 11, the pixel unit P1 still can automatically activate the anti-overexposure function within the maximum exposure time according to the SOC of the capacitor. In an embodiment, the maximum exposure time can be equivalent to, shorter than or longer than 1 millisecond (ms). Here, the definition of the "exposure time" for the first capacitor C1 and the second capacitor C2 is as follow. In terms of the first capacitor C1, the "exposure time" refers to the illuminating time of the light source 110 when the second switch SW2 is at an ON state; in terms of the second capacitor C2, the "exposure time" refers to the illuminating time of the light source 110 when the third switch SW3 is at an ON state.

The operations of the anti-overexposure circuit structure 121 at other pixel units P1 are similar or identical to that at the said pixel unit P1 disclosed above, and the similarities are not repeated here. According to the said operation principles, depending on the SOC of each of the pixel units P1 of the anti-overexposure circuit structure 121, it is possible that the first switches SW1 of one or some pixel units P1 are turned off (this indicates that this or these pixel units P1 no more exposure), but the first switches SW1 of the remaining pixel units P1 are turned on (this indicates that the remaining pixel units P1 continue to be exposed); or, it is possible that the first switches SW1 of all pixel units P1 are turned off or turned on.

The controller 130 can calculate the distance D1 between each of the pixel units P1 and the target T according to the SOC of the first capacitor C1 and the SOC of the second capacitor C2 of each of the pixel units P1 of the anti-overexposure circuit structure 121 to obtain a 3D diagram of a surface TS of the target T (the surface TS is illustrated in FIG. 1). Since each of the pixel units P1 can independently activate the anti-overexposure mechanism, the amount of over-exposed pixel units P1 can be reduced, and none of the pixel units P1 will be avoid to being over-exposed. Therefore, the resolution of the obtained image of the surface TS can be increased, and the overall resolution of the 3D outline of the surface TS can also be increased.

As indicated in FIG. 2B, the first switch SW1 can be realized by an NPN-type bipolar junction transistor (BJT). The first switch SW1 can also be realized by a PNP-type BJT, a P-type or an N-type metal-oxide-semiconductor field-effect transistor (MOSFET) or other circuit structures of switches as long as these transistors can match the control circuit 1212 or the control circuit 1212 can be suitably modified.

As indicated in FIG. 2B, the control circuit 1212 can be realized by a comparator. The control circuit 1212 has an output end 1212a, a positive phase input end 1212b and an inverse phase input end 1212c. The output end 1212a is coupled to the first switch SW1, the inverse phase input end 1212c is coupled to the reference voltage Vref, and the positive phase input end 1212b is coupled to the voltage V1 of the first capacitor C1 or the voltage V2 of the second capacitor C2, wherein the voltage V1, such as the voltage value at node A, represents the SOC of the first capacitor C1, and is positively proportional to the SOC of the first capacitor C1 the voltage V2, such as the voltage value at node B, represents the SOC of the second capacitor C2, and is positively proportional to the SOC of the second capacitor C2. In the present example, when the voltage V1 or the voltage V2 is lower than a reference voltage Vref, this indicates that the pixel unit P1 is overexposed; meanwhile, the output end 1212a of the control circuit 1212 outputs a low-level signal (such as 0) to turn off the first switch SW1 and stop the exposure of the pixel unit P1.

In another embodiment, the first switch SW1 is such as a PNP-type BJT, the inverse phase input end 1212c is coupled to the voltage V1 of the first capacitor C1 or the voltage V2 of the second capacitor C2, and the positive phase input end 1212*b* is coupled to the reference voltage Vref. Under such circumstance, when the reference voltage Vref is higher than the voltage V1 or the voltage V2, this indicates that the pixel unit P1 is overexposed, meanwhile, the output end 1212*a* of the control circuit 1212 outputs a high-level signal (such as 1) to turn off the first switch SW1 and stop the exposure of the pixel unit P1.

Figure 3:
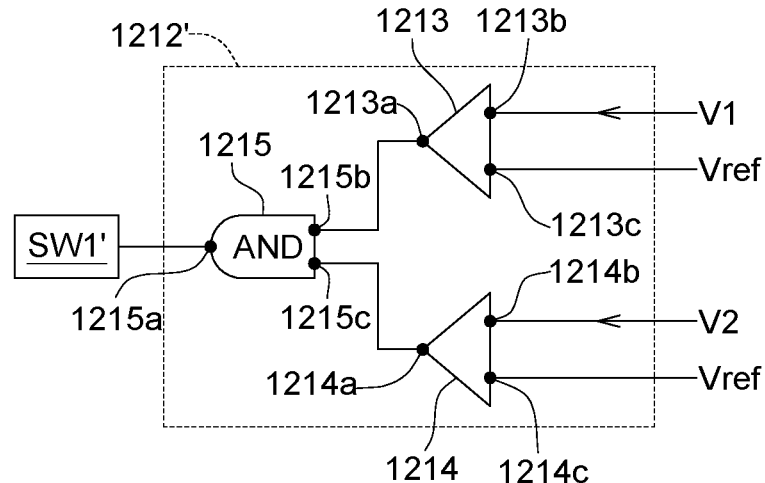
FIG. 3 is a schematic diagram of a control circuit according to another embodiment of the invention.

Referring to FIG. 3, a schematic diagram of a control circuit 1212' according to another embodiment of the invention is shown. The control circuit 1212 of the image sensor 120 of the electronic device 10 of FIG. 1 can be replaced by the control circuit 1212', and the same technical effect still can be achieved.

As indicated in FIG. 3, the control circuit 1212' includes a logic gate, a first comparator 1213 and a second comparator 1214. The logic gate can be realized by an AND logic gate 1215. The first comparator 1213 has a first output end 1213*a*, a first positive phase input end 1213*b* and a first inverse phase input end 1213*c*, wherein the first inverse phase input end 1213*c* is electrically coupled to the reference voltage Vref, and the first positive phase input end 1213*b* is electrically coupled to the voltage V1 of the first capacitor C1. The second comparator 1214 has a second output end 1214*a*, a second positive phase input end 1214*b* and a second inverse phase input end 1214*c*, wherein the second inverse phase input end 1214*c* is electrically coupled to the reference voltage Vref, and the second positive phase input end 1214*b* is electrically coupled to the voltage V2 of the second capacitor C2. The AND logic gate 1215 includes a gate output end 1215*a*, a first gate input end 1215*b* and a second gate input end 1215*c*. The gate output end 1215*a* is electrically coupled to the first switch SW1', the first output end 1213*a* of the first comparator 1213 is electrically coupled to the first gate input end 1215*b*, and the second output end 1214*a* of the second comparator 1214 is electrically coupled to the second gate input end 1215*c*. The structure of the first switch SW1' is similar or identical to that of the first switch SW1, and the similarities are not repeated here.

As indicated in FIG. 3, when the voltage V1 is higher than the reference voltage Vref, the first comparator 1213 outputs a high-level signal; when the voltage V1 is lower than the reference voltage Vref, the first comparator 1213 outputs a low-level signal. Similarly, when the voltage V2 is higher than the reference voltage Vref, the second comparator 1214 outputs a high-level signal; when the voltage V2 is lower than the reference voltage Vref, the second comparator 1214 outputs a low-level signal. When the input values of both the first gate input end 1215*b* and the second gate input end 1215*c* of the AND logic gate 1215 are high-level signals (both the SOC of the first capacitor C1 and the SOC of the second capacitor C2 are higher than a predetermined level), the gate output end 1215*a* of the AND logic gate 1215 outputs a high-level signal to turn off the first switch SW1' (the pixel unit P1 continues to be exposed). When at least one of the voltage V1 and the voltage V2 is lower than the reference voltage Vref, the gate output end 1215*a* of the AND logic gate 1215 outputs a low-level signal to turn off the first switch SW1' and avoid the pixel unit P1 being overexposed.

Figure 4:
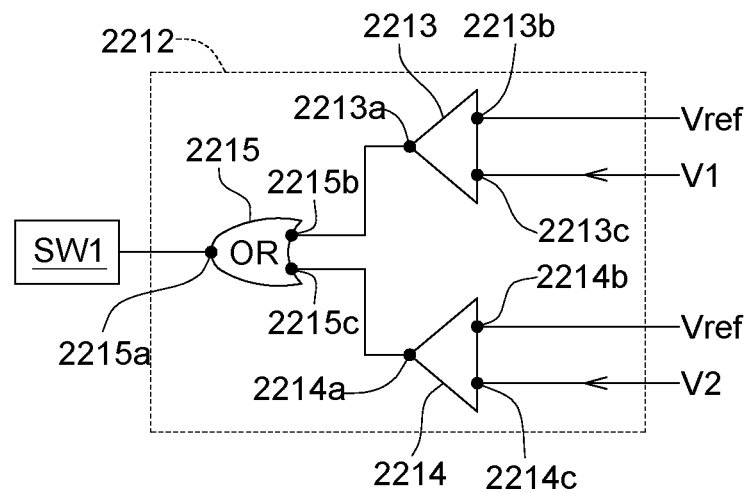
FIG. 4 is a schematic diagram of a control circuit according to another embodiment of the invention.

Referring to FIG. 4, a schematic diagram of a control circuit 2212 according to another embodiment of the invention is shown. The control circuit 1212 of the image sensor 120 of the electronic device 10 of FIG. 1 can be replaced by the control circuit 2212, and the same technical effect still can be achieved.

As indicated in FIG. 4, the control circuit 2212 includes a first comparator 2213, a second comparator 2214 and an OR logic gate 2215. The first comparator 2213 has a first output end 2213*a*, a first positive phase input end 2213*b* and a first inverse phase input end 2213*c*, wherein the first inverse phase input end 2213*c* is electrically coupled to the voltage V1 of the first capacitor C1, and the first positive phase input end 2213*b* is electrically coupled to the reference voltage Vref. The second comparator 2214 has a second output end 2214*a*, a second positive phase input end 2214*b* and a second inverse phase input end 2214*c*, wherein the second inverse phase input end 2214*c* is electrically coupled to the voltage V2 of the second capacitor C2, and the second positive phase input end 2214*b* is electrically coupled to the reference voltage Vref. The OR logic gate 2215 includes a gate output end 2215*a*, a first gate input end 2215*b* and a second gate input end 2215*c*. The gate output end 2215*a* is electrically coupled to the gate of the first switch SW1 the first output end 2213*a* of the first comparator 2213 is electrically coupled to the first gate input end 2215*b*; the second output end 2214*a* of the second comparator 2214 is electrically coupled to the second gate input end 2215*c*.

As indicated in FIG. 4, when the reference voltage Vref is higher than the voltage V1, the first comparator 1213 outputs a high-level signal; when the reference voltage Vref is lower than the voltage V1, the first comparator 1213 outputs a low-level signal. Similarly, when the reference voltage Vref is higher than the voltage V2, the second comparator 1214 outputs a high-level signal; when the reference voltage Vref is lower than the voltage V2, the second comparator 1214 outputs a low-level signal. When the input values of both the first gate input end 2215*b* and the second gate input end 2215*c* of the OR logic gate 2215 are low-level signals (both the SOC of the first capacitor C1 and the SOC of the second capacitor C2 are higher than the predetermined level), the gate output end 2215*a* of the OR logic gate 2215 outputs a low-level signal to keep the first switch SW1 at an ON state (the pixel unit P1 continues to be exposed). When at least one of the voltage V1 and the voltage V2 is lower than the reference voltage Vref, the gate output end 1215*a* of the OR logic gate 2215 outputs a high-level signal to turn off the first switch SW1 and avoid the pixel unit P1 being overexposed. In the present example, the first switch SW1, such as a P-type MOSFET, is switched to be turned on according to the low-level signal outputted from the OR logic gate 2215, and is switched to be turned off according to the high-level signal outputted from the OR logic gate 2215. In another embodiment, the first switch SW1 can also be realized by a PNP-type bipolar transistor, a P-type or an N-type metal-oxide-semiconductor field-effect transistor (MOSFET) or other types of switches as long as the control circuit 1212 can be suitably modified.

Figure 5:
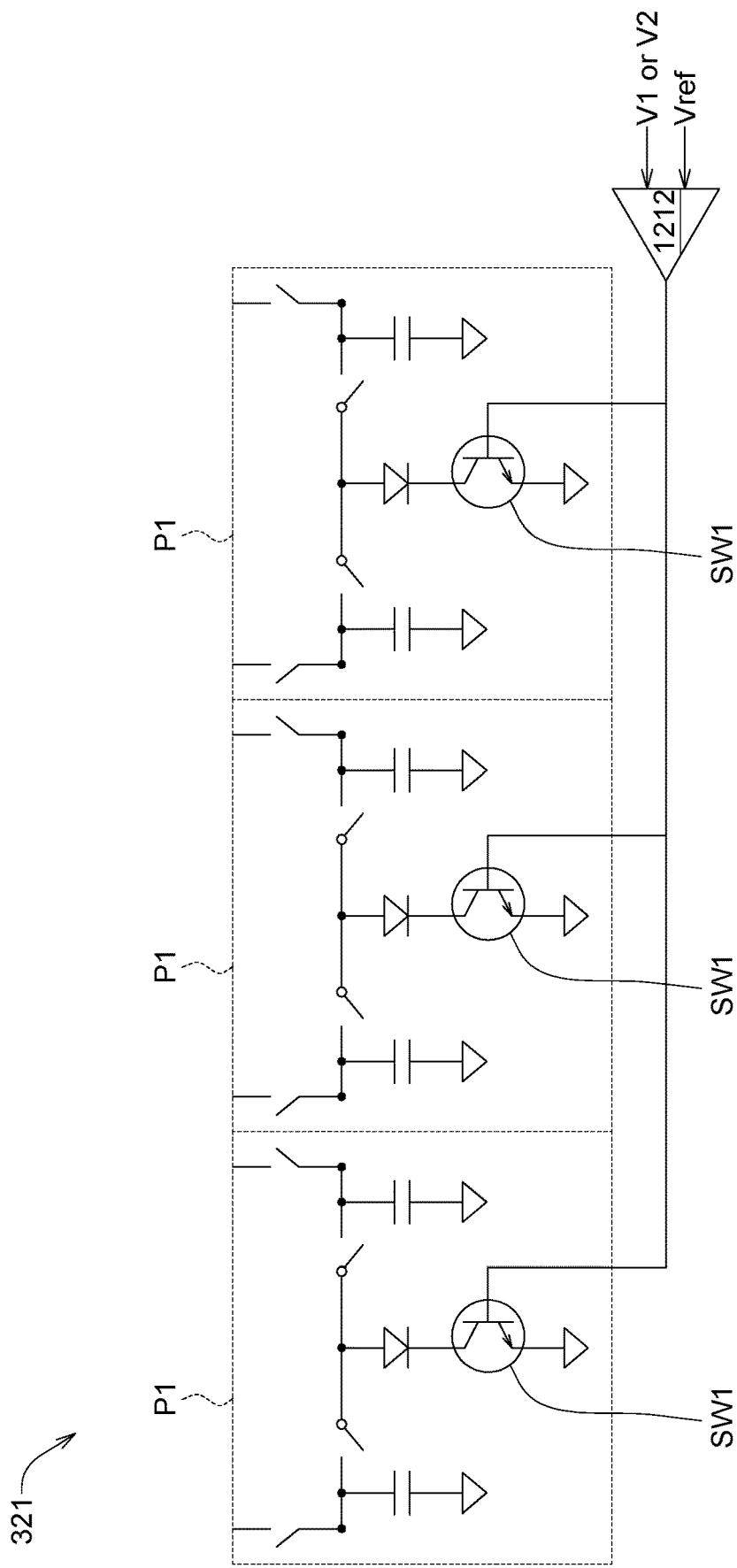
FIG. 5 is a schematic diagram of an anti-overexposure circuit structure according to another embodiment of the invention.

Referring to FIG. 5, a schematic diagram of an anti-overexposure circuit structure 321 according to another embodiment of the invention is shown. The anti-overexposure circuit structure 121 of the image sensor 120 of the electronic device 10 of FIG. 1 can be replaced by the anti-overexposure circuit structure 321, and the same technical effect still can be achieved.

The features of the anti-overexposure circuit structure 321 of the present embodiment are similar or identical to that of the anti-overexposure circuit structure 121 except for that at least some of the pixel units P1 of the anti-overexposure circuit structure 321 can share one control circuit 1212 to reduce the complexity of circuit layout and/or the manufacturing cost of the circuits. For example, as indicated in FIG. 5, the 3 first switches SW1 of the 3 pixel units P1 are connected in parallel and coupled to the control circuit 1212, which can concurrently switch the 3 first switches SW1 of the 3 pixel units P1 to be turned off to avoid the 3 pixel units P1 being overexposed. In another embodiment, the control circuit 1212 can be connected in parallel with less than or more than 3 pixel units P1, such as 2, 4, or more pixel units P1. In another embodiment, the control circuit 1212 of the anti-overexposure circuit structure 321 can be replaced by the control circuit 1212' or 2212.

In addition, the pixel units P1 of FIG. 5 sharing the same control circuit 1212 can be defined as a pixel group. In an embodiment, the anti-overexposure circuit structure 321 includes at least one pixel group. The amount of pixel groups is the same as that of the control circuit 1212 of the anti-overexposure circuit structure 321. As indicated in FIG. 5, the pixel units P1 are adjacent to each other. Since the optical characteristics of the reflective light L1 received by adjacent pixel units P1 (such as intensity) are similar, the image capturing quality still can meet the expectation even when the control circuit 1212 is shared by the pixel units P1.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation to encompass all such modifications and similar arrangements and procedures.

What is claimed is:

1. An anti-overexposure circuit structure, comprising:
   a first capacitor;
   a second capacitor;
   a photo diode coupled to the first capacitor and the second capacitor;
   a first switch serially connected to the photo diode; and
   a control circuit coupled to the first switch and configured to:
      control the first switch to be at an open circuit state when state of charge (SOC) of the first capacitor or SOC of the second capacitor is lower than a predetermined level.

2. The anti-overexposure circuit structure according to claim 1, wherein the control circuit is a comparator, wherein an output end of the comparator is coupled to the first switch, an input end of the comparator is coupled to a reference voltage, and the other input end of the comparator is coupled to voltage of the first capacitor or the second capacitor.

3. The anti-overexposure circuit structure according to claim 1, wherein the control circuit comprises:
   a first comparator, wherein an input end of the first comparator is coupled to a reference voltage, the other input end of the first comparator is coupled to the voltage of the first capacitor, and the first comparator comprises a first output end;
   a second comparator, wherein an input end of the second comparator is coupled to a reference voltage, the other input end of the second comparator is coupled to the voltage of the second capacitor, and the second comparator comprises a second output end; and
   a AND logic gate, comprising a gate output end, a first gate input end and a second gate input end;
   wherein the gate output end is coupled to the switch, the first output end is coupled to the first gate input end, and the second output end is coupled to the second gate input end.

4. The anti-overexposure circuit structure according to claim 3, wherein the first switch is a metal-oxide-semiconductor field-effect transistor (MOSFET), the gate output end of the AND logic gate is coupled to the gate of the first switch.

5. The anti-overexposure circuit structure according to claim 1, wherein the first capacitor, the second capacitor, the photo diode and the first switch form a pixel unit, the anti-overexposure circuit structure comprises a plurality of pixel units whose first switches are coupled to the control circuit.

6. The anti-overexposure circuit structure according to claim 5, wherein the pixel units are adjacent to each other.

7. The anti-overexposure circuit structure according to claim 5, wherein the pixel units coupled to the control circuit form a pixel group, and the anti-overexposure circuit comprises a plurality of pixel groups.

8. An electronic device, comprising:
   an anti-overexposure circuit structure according to claim 1; and
   a processor electrically coupled to the anti-overexposure circuit structure.

9. The electronic device according to claim 8, wherein the control circuit at least comprises a comparator; an output end of the comparator is coupled to the first switch, an input end of the comparator is coupled to a reference voltage, and the other input end of the comparator is coupled to the voltage of the first capacitor or the voltage of the second capacitor.

10. The electronic device according to claim 8, wherein the control circuit comprises:
    a first comparator, wherein an input end of the first comparator is coupled to a reference voltage, the other input end of the first comparator is coupled to the voltage of the first capacitor, and the first comparator comprises a first output end;
    a second comparator, wherein an input end of the second comparator is coupled to a reference voltage, the other input end of the second comparator is coupled to the voltage of the second capacitor, and the second comparator comprises a second output end; and
    a AND logic gate, comprising a gate output end, a first gate input end and a second gate input end;
    wherein the gate output end is coupled to the switch, the first output end is coupled to the first gate input end, and the second output end is coupled to the second gate input end.

11. The electronic device according to claim 10, wherein the first switch is an MOSFET, and the gate output end of the AND logic gate is coupled to the gate of the first switch.

12. The electronic device according to claim 8, wherein the first capacitor, the second capacitor, the photo diode and the first switch form a pixel unit, and the anti-overexposure circuit structure comprises a plurality of pixel units whose first switches are coupled to the control circuit.

13. The electronic device according to claim 12, wherein the pixel units are adjacent to each other.

14. The electronic device according to claim 12, wherein the pixel units coupled to the control circuit form a pixel group, and the anti-overexposure circuit structure comprises a plurality of pixel groups.

* * * * *